US012571864B2

(12) United States Patent
Schmale et al.

(10) Patent No.: US 12,571,864 B2
(45) Date of Patent: Mar. 10, 2026

(54) MAGNETIC RESONANCE COIL DEVICE COMPRISING A FLEXIBLE ARRAY WITH MULTIPLE MAGNETIC RESONANCE RECEIVE COILS

(71) Applicant: KONINKLIJKE PHILIPS N.V., Eindhoven (NL)

(72) Inventors: Ingo Schmale, Hamburg (DE); Christoph Günther Leussler, Hamburg (DE); Oliver Lips, Hamburg (DE); Peter Vernickel, Hamburg (DE); Peter Caesar Mazurkewitz, Hamburg (DE); Christian Findeklee, Norderstedt (DE); Josef Scholz, Halstebek (DE)

(73) Assignee: Koninklijke Philips N.V., Eindhoven (NL)

( * ) Notice: Subject to any disclaimer, the term of this patent is extended or adjusted under 35 U.S.C. 154(b) by 148 days.

(21) Appl. No.: 18/290,308

(22) PCT Filed: May 7, 2022

(86) PCT No.: PCT/EP2022/062383
§ 371 (c)(1),
(2) Date: Nov. 13, 2023

(87) PCT Pub. No.: WO2022/238275
PCT Pub. Date: Nov. 17, 2022

(65) Prior Publication Data
US 2024/0248158 A1 Jul. 25, 2024

(30) Foreign Application Priority Data
May 14, 2021 (EP) ..................................... 21173798

(51) Int. Cl.
*G01R 33/34* (2006.01)
*G01R 33/3415* (2006.01)

(52) U.S. Cl.
CPC ... *G01R 33/3415* (2013.01); *G01R 33/34084* (2013.01)

(58) Field of Classification Search
CPC ...................... G01R 33/3415; G01R 33/34084
See application file for complete search history.

(56) References Cited

U.S. PATENT DOCUMENTS

2008/0238424 A1 10/2008 Possanzini
2018/0263561 A1 9/2018 Jones
(Continued)

FOREIGN PATENT DOCUMENTS

WO 2017210156 A1 12/2017
WO 2022002650 A1 1/2022

OTHER PUBLICATIONS

International Search Report and Written Opinion from PCT/EP2022/062383 mailed Aug. 23, 2022.

*Primary Examiner* — G. M. A Hyder

(57) ABSTRACT

The invention relates to a magnetic resonance coil device comprising a flexible array (100) with multiple magnetic resonance receive coils (440). According to the invention, a magnetic resonance coil device for a magnetic resonance system is provided, comprising an array (100) with multiple magnetic resonance receive coils (400) which are configured for receiving a magnetic resonance radiofrequency signal, and two outer layers (200, 201), wherein the magnetic resonance receive coils (400) are arranged between the outer layers (200, 201) in such a way that at least some of the magnetic resonance receive coils (400) each partly overlap with at least one other neighboring magnetic resonance receive coil (400) so that respective overlapping regions between two respective neighboring magnetic resonance receive coils (400) are formed, wherein within at least some of these overlapping regions at least one spacer (300) is arranged, respectively, and wherein at least one of the outer (Continued)

layers is flexible. In this way, a versatile magnetic resonance coil device for a magnetic resonance system with an array (100) of multiple magnetic resonance receive coils (400) is provided which can be easily adapted to the shape of different parts of the human body.

20 Claims, 5 Drawing Sheets

(56) References Cited

U.S. PATENT DOCUMENTS

| | | | |
|---|---|---|---|
| 2018/0372815 A1 | 12/2018 | Candidus et al. | |
| 2019/0154775 A1 | 5/2019 | Stack et al. | |
| 2019/0310328 A1 | 10/2019 | Fuqua et al. | |
| 2019/0310329 A1 | 10/2019 | Malik et al. | |
| 2019/0353722 A1 | 11/2019 | Stormont et al. | |
| 2020/0271738 A1 | 8/2020 | Qin et al. | |
| 2021/0055362 A1* | 2/2021 | Feng ..................... | A61B 5/055 |

\* cited by examiner

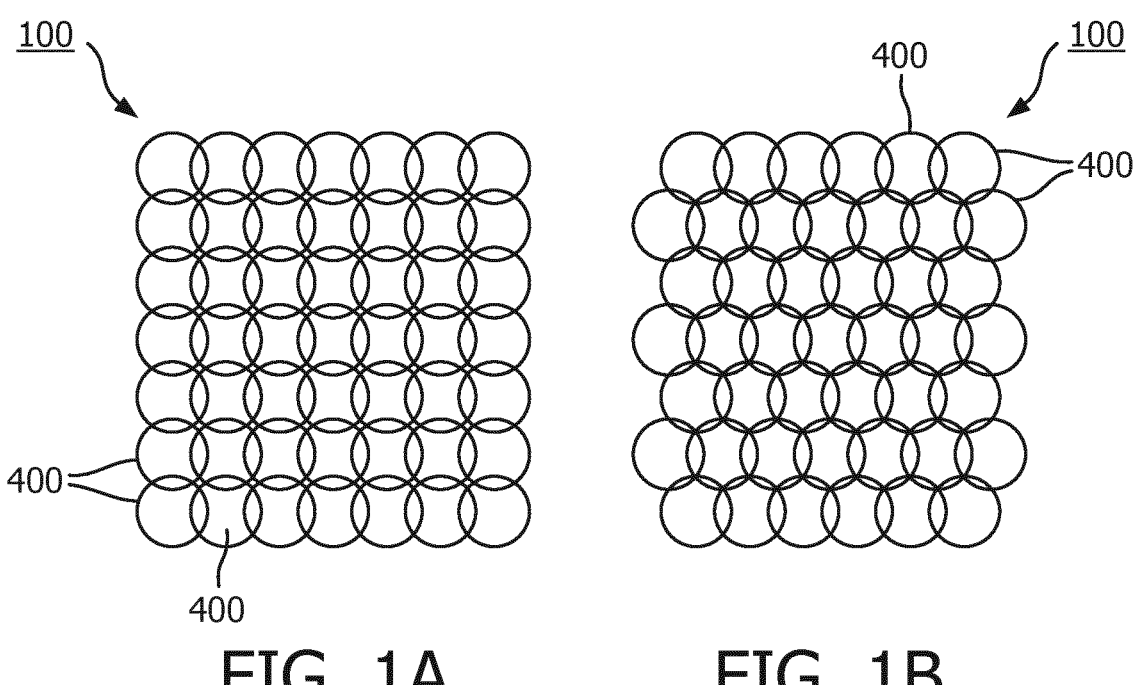
FIG. 1A                    FIG. 1B
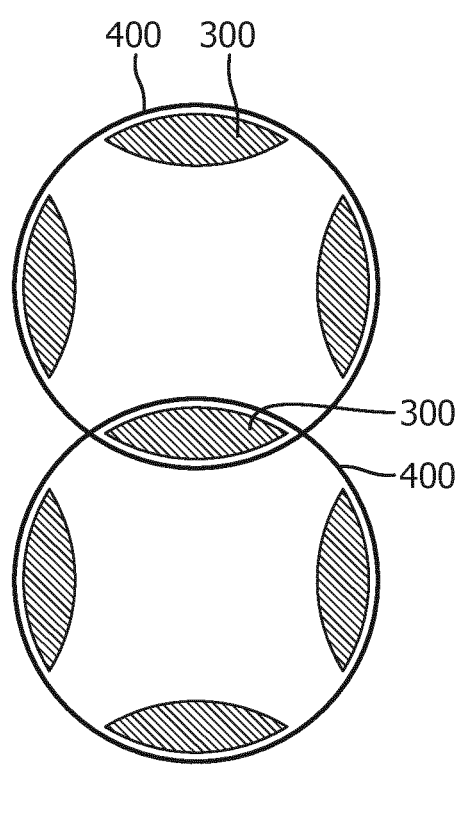
FIG. 2

311          500          312

311     510     500     312          400

400

MAGNETIC RESONANCE COIL DEVICE COMPRISING A FLEXIBLE ARRAY WITH MULTIPLE MAGNETIC RESONANCE RECEIVE COILS

CROSS REFERENCE TO RELATED APPLICATIONS

This application is a U.S. national phase application of International Application No. PCT/EP2022/062383 filed on May 7, 2022, which claims the benefit of EP Application Serial No. 21173798.6 filed on May 14, 2021 and is incorporated herein by reference.

FIELD OF THE INVENTION

The invention relates to the field of magnetic resonance imaging (MRI) systems, and in particular to a magnetic resonance coil device for a magnetic resonance system, comprising an array with multiple magnetic resonance receive coils which are configured for receiving a magnetic resonance radiofrequency signal.

BACKGROUND OF THE INVENTION

Magnetic resonance imaging is an imaging technology that is based on the principles of nuclear magnetic resonance, i.e. that atomic nuclei with non-zero spin have a magnetic moment. In medical MRI, the atomic nuclei with non-zero spin is usually the nuclei of hydrogen atoms, which are present in the human or animal body. Radio frequency (RF) waves forming a B1-excitation field, are directed at the nuclei in an external magnetic field, leading to an excitation of the protons and a subsequent relaxing process of the protons. Relaxation of the protons, results in RF signals being emitted by the nuclei that can be detected and processed to form an image.

A typical MRI system generally comprises a magnet, for example a superconducting electromagnet, that generates a strong static magnetic field, gradient coils that generate linear variations in the static magnetic field, RF transmit coils that generate the B1-excitation field, and RF receive coils that detect the magnetic resonance RF signal emitted by the relaxing nuclei.

Typically, multiple RF receive coils are used in MRI systems forming a receive coil array. These RF receive coils, also called "surface coils" typically comprise several receiving loops, which are arranged in arrays. Typical spatial orientations of these arrays are Cartesian or hexagonal. Conventional RF receive coils and RF receive coil arrays tend to be bulky and/or rigid and are configured to be maintained at a fixed position relative to other RF receive coils in the coil array and relative to the imaging subject, respectively. The bulkiness and lack of flexibility often prevents the RF receive coils from coupling most efficiently with the desired anatomy of the imaging subject and tend to make the imaging process uncomfortable to the imaging subject. Therefore, many different coils exist for many different imaging situations: foot coils, ankle coils, knee coils, shoulder coils, etc. for individual body parts, or cardiac or anterior coils for the torso.

US 2008/238424 A1 discloses a flexible RF coil array based on PCB-based coil loops that are coupled by flexible hinges. According to this document, radio frequency coils array includes a plurality of conductive RF loops configured to excite or receive magnetic resonance signals, and a plurality of electronics modules corresponding to the plurality of conductive RF loops. The electronics modules are grouped together in a compact electronics region. Each RF coil is operatively connected with a corresponding electronics module. Each electronics module includes at least a pre-amplifier.

SUMMARY OF THE INVENTION

It is an object of the invention to provide a versatile magnetic resonance coil device for a magnetic resonance system with an array of multiple magnetic resonance receive coils which can be easily adapted to the shape of different parts of the human body.

According to the invention, this object is addressed by the subject matter of the claim 1. Preferred embodiments of the invention are described in the sub claims.

Therefore, according to the invention, a magnetic resonance coil device for a magnetic resonance system is provided which comprises an array with multiple magnetic resonance receive coils which are configured for receiving a magnetic resonance radiofrequency signal, and two outer layers, wherein the magnetic resonance receive coils are arranged between the outer layers in such a way that at least some of the magnetic resonance receive coils each partly overlap with at least one other neighboring magnetic resonance receive coil so that respective overlapping regions between two respective neighboring magnetic resonance receive coils are formed, wherein within at least some of these overlapping regions at least one spacer is arranged, respectively, and wherein at least one of the outer layers is flexible.

In this way, it is possible that magnetic resonance receiver coils which are sandwiched by the two outer layers can slide and move loosely between the outer layers. Their respective positions relative to each other and their overlap with one or more neighboring magnetic resonance receive coils may be ensured by the spacers. This allows for bending of the magnetic resonance coil device in two directions while its components still remain in position, and overlap of respective magnetic resonance receive coils with respect to each other is maintained. In this way, not only bending around a cylinder or torso is possible, i.e. bending in one direction, but also bending around structures which are convex in two dimensions, like head, shoulder or knee. According to a preferred embodiment of the invention, not only a part but all of the magnetic resonance receive coils each partly overlap with at least one other neighboring magnetic resonance receive coil so that respective overlapping regions between two respective neighboring magnetic resonance receive coils are formed, wherein within in all of these overlapping regions at least one spacer is arranged, respectively.

While, in general, the surfaces of the spacers may be designed in different ways, according to a preferred embodiment of the invention, for at least some of the spacers, the surfaces of the spacers which face the inner sides of the outer layers, are flat surfaces. Preferably, for all of the spacers, the surfaces of the spacers which face the inner sides of the outer layers, are flat surfaces. Further, it is preferred that, in a top view onto the flat surfaces of the spacers, the shape of the spacers is an almond shape and the shape of the respective magnetic resonance receive coils is a circular shape. Here, the term "almond shape" is understood to be a shape which is achieved by two curved lines, preferably segments of a circle, which are attached to each other at the ends of the lines. This might form an elliptical or vesica piscis shape.

Other shape combinations for spacers and coils are possible, like square, hexagonal or octagonal shapes.

Further, according to a preferred embodiment of the invention, at least some of the spacers, in a cross-sectional view which is perpendicular to the flat surfaces, have a rectangular shape. Preferably, all of the spacers, in a cross-sectional view which is perpendicular to the flat surfaces, have a rectangular shape. According to another preferred embodiment of the invention, at least some of the spacers, in a cross-sectional view which is perpendicular to the flat surfaces, have a rectangular shape with grooves in the lateral surfaces which connect the flat surfaces which are facing the inner sides of the outer layers, with each other. Preferably, this applies for all of the spacers. In this way, the loops of the respective magnetic resonance receive coils can slide into these grooves and, hence, they can be easily held in their intended places.

According to a further preferred embodiment of the invention, at least some of the spacers are fixedly attached to the inner sides of the outer layers. Preferably, this applies to all of the spacers. The spacers can be fixed to the inner sides of the outer layers in different ways. Preferably, the spacers are glued to the inner sides of the outer layers.

Though, in general, the invention allows for fixing magnetic resonance receive coils within the sandwich structure between the outer layers, according to a preferred embodiment of the invention, at least some of the magnetic resonance receive coils which partly overlap with a least one other neighboring magnetic resonance receive coil and which comprise a spacer in the respective overlapping region are neither fixed to another spacer nor fixed to any of the outer layers. According to the preferred embodiment of the invention, the loops of the magnetic resonance receive coils are therefore arranged very loosely between the outer layers, e.g. within voids within the coil array. The motion of the loops is only limited by the spacers between the inner sides of the outer layers. This provides for high flexibility of the magnetic resonance coil device. In this respect, preferably, all of the magnetic resonance receive coils which partly overlap with a least one other neighboring magnetic resonance receive coil and which comprise a spacer in the respective overlapping region are neither fixed to another spacer nor fixed to any of the outer layers.

In general, different types of materials may be used for the spacers. According to a preferred embodiment of the invention, at least some of the spacers are at least partly formed from a flexible material. Preferably, at least some of the spacers are at least partly formed from a flexible foam. More preferably, all of the spacers are formed from a flexible foam.

According to a preferred embodiment of the invention, at least some of the spacers comprise two parts, which are separate from each other or which are connected to each other by a hinge, preferably by a film hinge. This provides for additional flexibility. Preferably, all of the spacers comprise two parts, which are separate from each other or which are connected to each other by a hinge.

Further, according to a preferred embodiment of the invention, at least some of the spacers comprise a rigid compartment in which at least one electrical device is arranged. In this respect, according to a preferred embodiment of the invention, the electrical device is a low noise amplifier (LNA) for amplifying the magnetic resonance radiofrequency signal received by a magnetic resonance receive coil. Preferably, the LNA is connected to a feeding point of the magnetic resonance coil device by a micro coaxial cable.

According to a preferred embodiment of the invention, the outer layer(s) which is/are flexible is/are reversibly deformable to convex surfaces. In this way, since no area preserving material is used for the outer layers, bending in two directions is possible. In this respect, preferably, the outer layer(s) which is flexible is/are made from textile sheet(s). Such textile sheets may be made from different types of fabrics, e.g. woven or non-woven fleece. According to a preferred embodiment of the invention, the outer layer(s) which is/are flexible does/do not exhibit flexibility along their extension directions. In case of an outer layer which is made from a textile material this means that no stretch material is used according to this preferred embodiment of the invention. Though, according to the invention, the outer layers may be completely closed, according to a preferred embodiment of the invention, at least one of, preferably both of the outer layers comprise aeration holes. This allows for air circulation and, therefore, for a certain cooling of the body part of a patient on which the magnetic resonance coil device is applied. Preferably, at least some, more preferably all of the magnetic resonance receive coils are arranged in a Cartesian or hexagonal spatial orientation relative to each other.

As described above, the flexibility of the array is achieved due to the fact that at least some of the magnetic resonance receive coils are arranged in voids between the spacers and at least one of the outer layers in flexible. In this respect, it is preferred that both outer layers are flexible. Further, in this way, though the magnetic resonance receive coils can move which provides for the flexibility, they are held in their intended places due to the spacers. Though the highest flexibility is achieved when all the magnetic resonance receive coils are arranged between the two outer layers in this way, it might be sufficient just to have some of the magnetic resonance receive coils or magnetic resonance receive coils in a certain area of the array arranged in this way. Therefore, the man skilled in the art will be able to decide on the basis of his expert knowledge how many and which of the magnetic resonance receive coils should be arranged in this way to achieved the desired flexibility for different applications.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings:

FIG. 1A schematically depicts an array with multiple magnetic resonance receive coils in a Cartesian orientation relative to each other;

FIG. 1B schematically depicts an array with multiple magnetic resonance receive coils in a hexagonal orientation relative to each other;

FIG. 2 schematically depicts two neighboring magnetic resonance receive coils which overlap with each other according to a preferred embodiment of the invention;

DETAILED DESCRIPTION OF EMBODIMENTS

Figure 3:
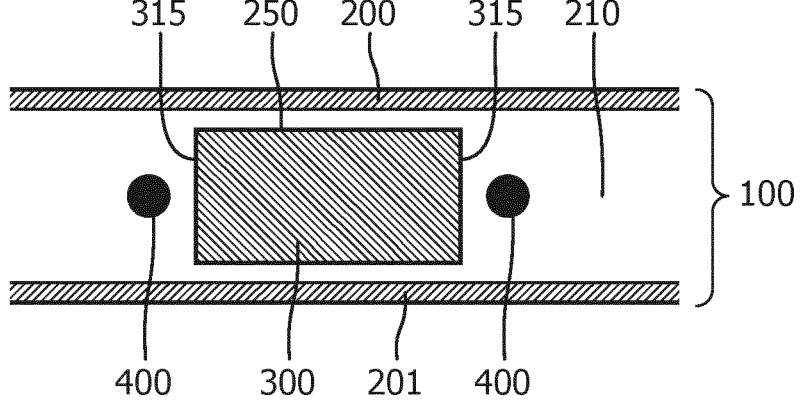
FIG. 3 schematically depicts a sectional view of a part of an array with multiple magnetic resonance receive coils according to a preferred embodiment of the invention.

The invention allows for different relative arrangements of the magnetic resonance receive coils 400 which are configured for receiving a magnetic resonance radiofrequency signal. In this respect, FIG. 1A schematically depicts an array 100 with multiple magnetic resonance receive coils 400 in a Cartesian orientation relative to each other while FIG. 1B schematically depicts an array 100 with multiple magnetic resonance receive coils 400 in a hexagonal orientation relative to each other. For the sake of clarity, in FIGS. 1A and 1B not all the magnetic resonance receive coils 400 have been identified with reference numerals. In both cases, except for the most outer magnetic resonance receive coils 400, all magnetic resonance receive coils 400 overlap with four neighboring magnetic resonance receive coils 400.

From FIG. 2 two neighboring magnetic resonance receive coils 400 which overlap with each other are shown in more detail. Preferably, all overlapping regions of the array 100 according to the present embodiment are designed in this way. For the sake of clarity, all other neighboring magnetic resonance receive coils 400 have been omitted in FIG. 2. In the view of FIG. 2, the overlapping region between the two magnetic resonance receive coils 400 has an almond shape. In this overlapping region a spacer 300 is arranged which also has an almond shape.

FIG. 3 is a sectional view perpendicular to the view on the magnetic resonance receive coils 400 of FIG. 2. Here, it can be seen that the magnetic resonance receive coils 400 and the spacer 300 are sandwiched between two flexible outer layers 200, 201 which are made from a fabric material. The surfaces 250 of the spacer 300 which face the inner sides of the outer layers 200, 201 are flat surfaces, and, in a cross-sectional view which is perpendicular to the flat surfaces 250, the spacer 300 has a rectangular shape which means that also the surfaces 315 of the spacer 300 which are perpendicular to the surfaces 250 of the spacer 300 which face the inner sides of the outer layers 200, 201 are flat surfaces. In this way, the two magnetic resonance receive coils 400 are held in place relative to each other by the spacer 300.

Figure 4:
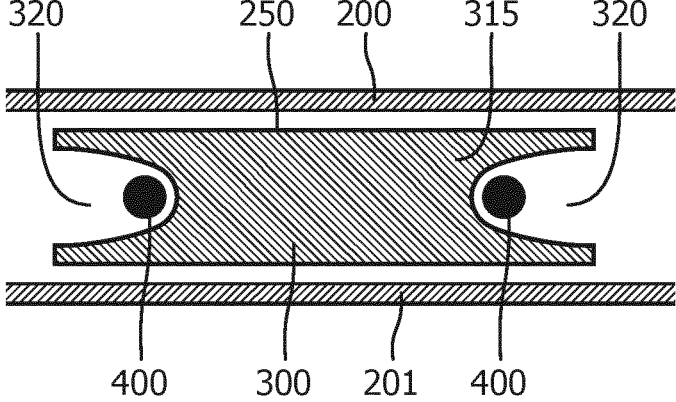
FIG. 4 schematically depicts a sectional view of a part of an array with multiple magnetic resonance receive coils according to another preferred embodiment of the invention.

According to an alternative embodiment of the invention which is depicted in FIG. 4, the spacer 300, in a cross-sectional view which is perpendicular to the flat surfaces 250, has a rectangular shape with grooves 320 in the lateral surfaces 315 which connect the flat surfaces 250 which are facing the inner sides of the outer layers 200, 201 with each other. In this way, the loops of the respective magnetic resonance receive coils 400 can slide into these grooves 320 between the outer regions 310 of the spacers 300 and, hence, they can be easily held in their intended places.

Though the schematic depictions of FIGS. 3 and 4 show some space between the spacer 300 and the outer layers 200, 201, according to the preferred embodiments of the invention described here, all spacers 300 of the array are fixedly attached to the inner sides of the outer layers 200, 201 by a glue. In this way, voids 210 between the two flexible layers 200, 201 are formed in which the magnetic resonance receive coils 400 may be arranged. In addition, the magnetic resonance receive coils 400 which are arranged in these voids 210 are neither fixed to another spacer 300 nor fixed to any of the outer layers 200, 201. This provides for the possibility of a free movement of the magnetic resonance receive coils 400 in the sandwich structure between the two flexible outer layers 200, 201 while the magnetic resonance receive coils 400 are held at their respective positions. In this way, a very flexible array 100 is achieved without the risk that some of the magnetic resonance receive coils 400 move away from their intended respective positions.

Figure 8:
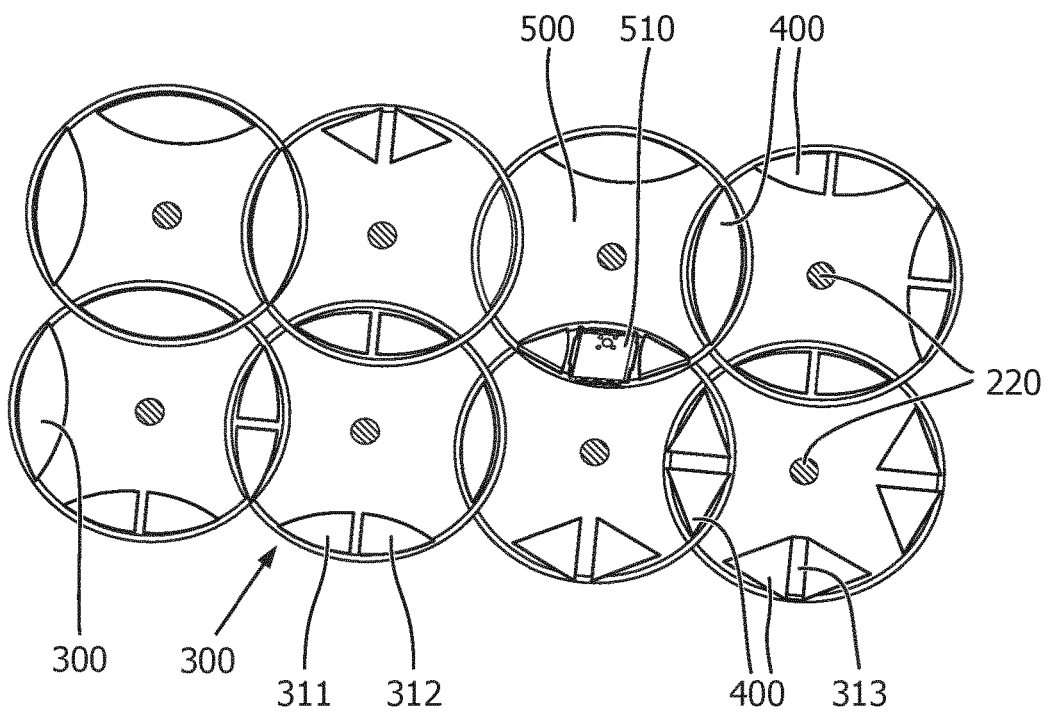
FIG. 8 schematically depicts an array with multiple magnetic resonance receive coils arranged on a lower outer layer before attaching the upper outer layer according to another preferred embodiment of the invention.

This flexibility is further enhanced since the spacers 300 itself are formed from a flexible material, preferably from a foam, and wherein at least some of the spacers 300 of the array 100 comprise two parts 311, 312 which are separate from each other. This is schematically depicted in FIG. 8 which also shows that the outer layers 200, 201 comprise aeration holes 220. FIG. 8 also shows the option that the two parts 311, 312 of the spacer 300 are connected to each other by a film hinge 313. For the sake of clarity, also in FIG. 8 not all the components of the array 100 are identified with reference numerals.

Figure 5:
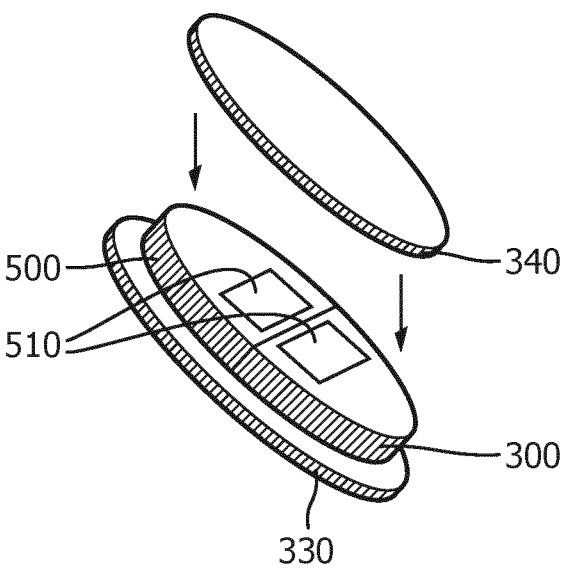
FIG. 5 schematically depicts a perspective view of a spacer with a rigid compartment for an electrical device according to a preferred embodiment of the invention.
Figure 6:
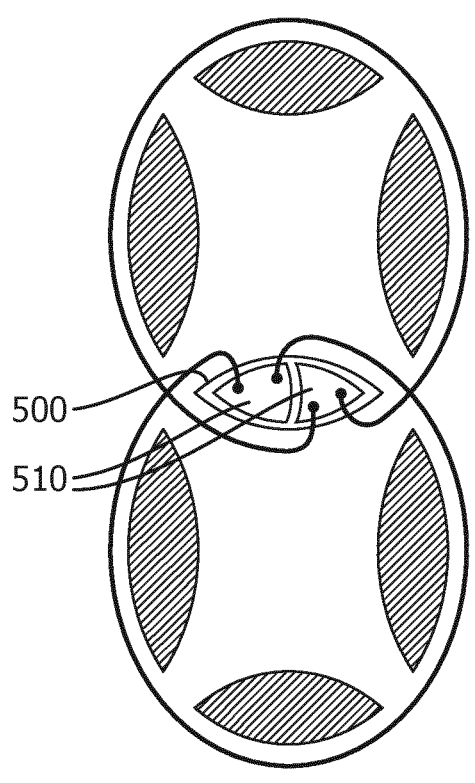
FIG. 6 schematically depicts two neighboring magnetic resonance receive coils which overlap with each other and which comprise a rigid compartment for electrical devices according to a preferred embodiment of the invention.

FIG. 5 schematically depicts a perspective view of a spacer with a rigid compartment 500 according to a preferred embodiment of the invention. In this rigid compartment 500 an electrical device 510 is arranged. This rigid compartment 500 may be closed at its top side and its bottom side with a respective cover 330, 340. According to the preferred embodiment of the invention described here, the electrical device 510 is a low noise amplifier (LNA) for amplifying the magnetic resonance radiofrequency signal received by a magnetic resonance receive coil 400. According to the present embodiment, the electrical device 510 is connected to a feeding point of the array 100 by a micro coaxial cable (not shown). As depicted in FIGS. 5 and 6, the rigid compartment 500 comprises two sub chambers wherein in each of these sub chambers an electrical device 510 is arranged. These electrical devices 510 are LNAs for two neighboring magnetic resonance receive coils 400 which means that in the array 100 according to this preferred embodiment of the invention, two neighboring magnetic resonance receive coils 400 share such a spacer 300 with a rigid compartment 500 for their two LNAs.

Figure 7A:
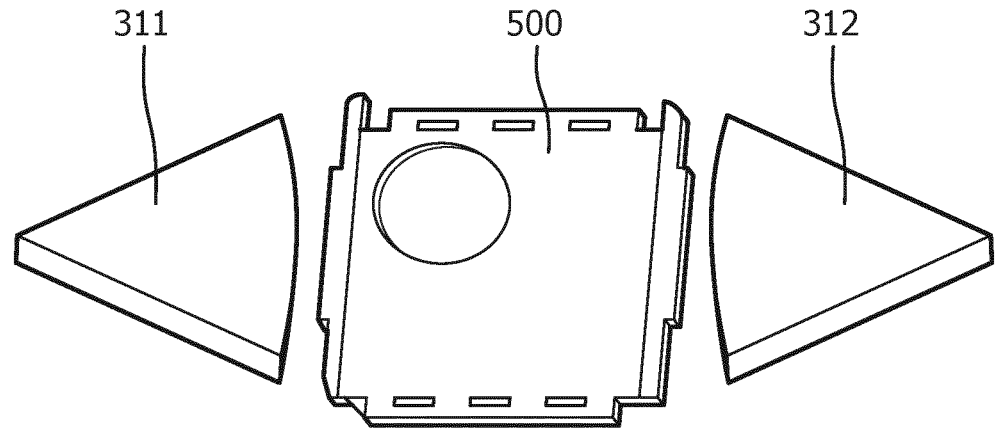
FIG. 7A schematically depicts a spacer with a rigid compartment for an electrical device before inserting the electrical device according to another preferred embodiment of the invention.
Figure 7B:
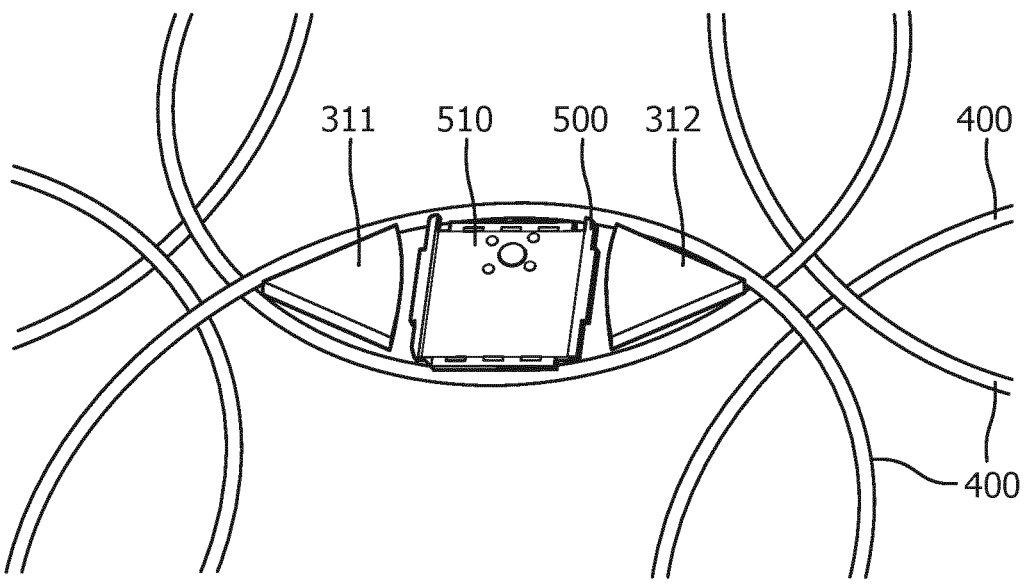
FIG. 7B schematically depicts a spacer with a rigid compartment for an electrical device after inserting the electrical device according to another preferred embodiment of the invention.
Figure 7C:
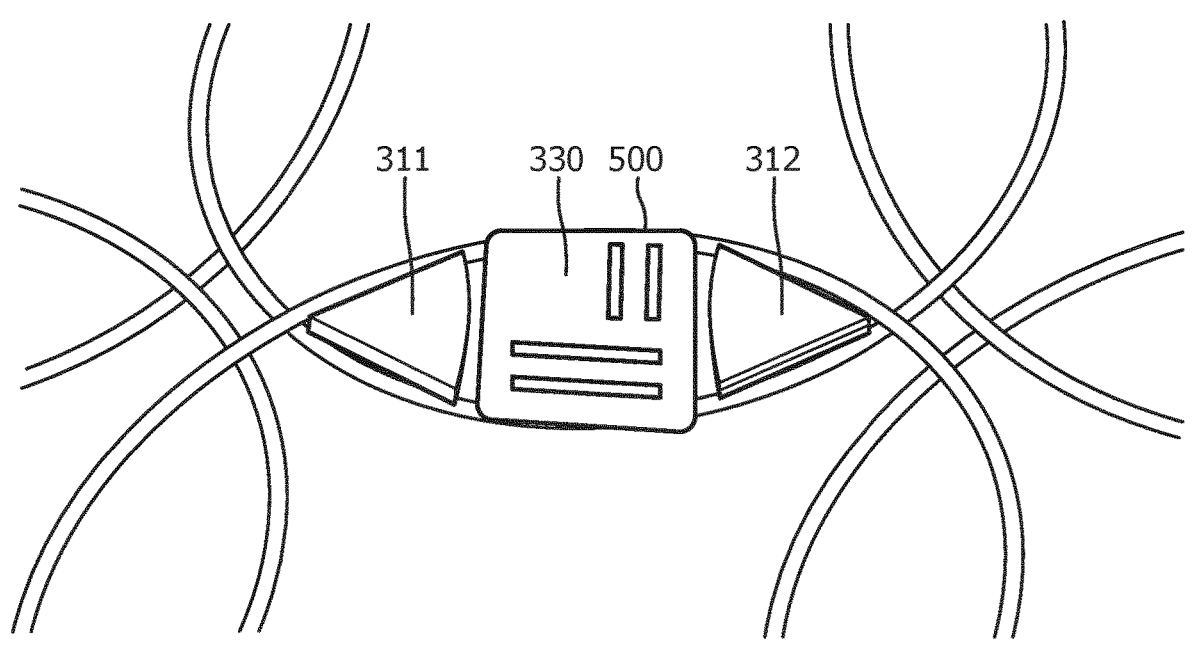
FIG. 7C schematically depicts a spacer with a rigid compartment for an electrical device after closing the compartment with a cover according to another preferred embodiment of the invention.

As schematically depicted in more detail in FIG. 7A, a spacer 300 with a rigid compartment 500 for the electrical devices 510 is comprised of the rigid compartment 500 itself and two spacer parts 311, 312 which are made from a flexible foam and which are connected to two opposite sides of the rigid compartment, preferably by gluing. Then, as schematically depicted in FIG. 7B, the electrical devices 510 are arranged inside the rigid compartment 500, and, as shown in FIG. 7C the rigid compartment 500 is closed with a cover 330.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST array 100
outer layer 200
outer layer 201
voids 210
aeration holes 220
flat surface of the spacers 250
spacers 300
outer regions of the spacers 310
first part of a spacer 311
second part of a spacer 312
film hinge 313
lateral surfaces 315
grooves 320
cover 330
cover 340
magnetic resonance receive coils 400
rigid compartment 500
electrical device 510

The invention claimed is:

1. A magnetic resonance coil device for a magnetic resonance system, comprising
  an array with multiple magnetic resonance receive coils which are configured for receiving a magnetic resonance radiofrequency signal, and two outer layers, wherein the magnetic resonance receive coils are arranged between the outer layers in such a way that at least some of the magnetic resonance receive coils each partly overlap with at least one other neighboring magnetic resonance receive coil so that respective overlapping regions between two respective neighboring magnetic resonance receive coils are formed, wherein; within at least some of these overlapping regions at least one spacer is arranged, respectively; at least some of the spacers are fixedly attached to the inner sides of the outer layers so that magnetic resonance receive coils are held in place relative to each other by the spacer; and at least one of the outer layers is flexible.

2. The magnetic resonance coil device according to claim 1, wherein for at least some of the spacers, the surfaces of the spacers which face the inner sides of the outer layers are flat surfaces.

3. The magnetic resonance coil device according to claim 2, wherein at least some of the spacers, in a cross-sectional view which is perpendicular to the flat surfaces, have a rectangular shape.

4. The magnetic resonance coil device according to claim 2, wherein at least some of the spacers, in a cross-sectional view which is perpendicular to the flat surfaces, have a rectangular shape with grooves in the lateral surfaces which connect the flat surfaces which are facing the inner sides of the outer layers with each other.

5. The magnetic resonance coil device according to claim 1, wherein at least some of the spacers are at least partly formed from a flexible material.

6. The magnetic resonance coil device according to claim 1, wherein at least some of the spacers comprise two parts which are separate from each other or which are connected to each other by a hinge, preferably by a film hinge.

7. The magnetic resonance coil device according to claim 1, wherein at least some of the spacers comprise a rigid compartment in which at least one electrical device is arranged.

8. The magnetic resonance coil device according to claim 7, wherein the electrical device is an LNA for amplifying the magnetic resonance radiofrequency signal received by a magnetic resonance receive coil.

9. The magnetic resonance coil device according to claim 1, wherein the outer layer(s) which is/are flexible is/are reversibly deformable to convex surfaces.

10. The magnetic resonance coil device according to claim 9, wherein the outer layer(s) which is/are flexible is/are made from textile sheets.

11. The magnetic resonance coil device according to claim 1, wherein the outer slayer(s) which is/are flexible does/do not exhibit flexibility along their extension directions.

12. The magnetic resonance coil device according to claim 1, wherein at least one of the outer layers comprises aeration holes.

13. The magnetic resonance coil device according to claim 1, wherein both outer layers are flexible.

14. A magnetic resonance coil device for a magnetic resonance system, comprising
  an array with multiple magnetic resonance receive coils which are configured for receiving a magnetic resonance radiofrequency signal, and two outer layers, the magnetic resonance receive coils being arranged between the outer layers in such a way that at least some of the magnetic resonance receive coils each partly overlap with at least one other neighboring magnetic resonance receive coil so that respective overlapping regions between two respective neighboring magnetic resonance receive coils are formed; and
  spacers disposed within at least some of these overlapping regions at least one spacer is arranged, respectively, wherein: at least some of the spacers are fixedly attached to the inner sides of the outer layers so that magnetic resonance receive coils are held in place relative to each other by the spacer; wherein at least one of the outer layers is flexible; and at least some of the magnetic resonance receive coils which partly overlap with a least one other neighboring magnetic resonance receive coil and which comprise one of the spacers in the respective overlapping region are neither fixed to another spaces nor fixed to any of the outer layers.

15. The magnetic resonance coil device according to claim 14, wherein for at least some of the spacers, the surfaces of the spacers which face the inner sides of the outer layers are flat surfaces.

16. The magnetic resonance coil device according to claim 15, wherein at least some of the spacers, in a cross-sectional view which is perpendicular to the flat surfaces, have a rectangular shape.

17. The magnetic resonance coil device according to claim 15, wherein at least some of the spacers, in a cross-sectional view which is perpendicular to the flat surfaces, have a rectangular shape with grooves in the lateral surfaces which connect the flat surfaces which are facing the inner sides of the outer layers with each other.

18. The magnetic resonance coil device according to claim 14, wherein at least some of the spacers comprise two parts which are separate from each other or which are connected to each other by a hinge, preferably by a film hinge.

19. The magnetic resonance coil device according to claim 14, wherein at least some of the spacers are at least partly formed from a flexible material.

20. The magnetic resonance coil device according to claim 14, wherein at least some of the spacers comprise a rigid compartment in which at least one electrical device is arranged.

\* \* \* \* \*